(12) United States Patent
Tseng et al.

(10) Patent No.: US 12,400,706 B2
(45) Date of Patent: Aug. 26, 2025

(54) IN MEMORY SEARCHING DEVICE

(71) Applicant: MACRONIX International Co., Ltd., Hsinchu (TW)

(72) Inventors: Po-Hao Tseng, Taichung (TW); Shao Yu Fang, New Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 185 days.

(21) Appl. No.: 18/347,571

(22) Filed: Jul. 6, 2023

(65) Prior Publication Data

US 2025/0014635 A1   Jan. 9, 2025

(51) Int. Cl.
| G11C 16/26 | (2006.01) |
| G11C 11/408 | (2006.01) |
| G11C 11/4094 | (2006.01) |
| G11C 11/4096 | (2006.01) |
| G11C 15/04 | (2006.01) |
| G11C 16/04 | (2006.01) |

(52) U.S. Cl.
CPC ...... *G11C 11/4096* (2013.01); *G11C 11/4085* (2013.01); *G11C 11/4094* (2013.01); *G11C 15/046* (2013.01); *G11C 16/0483* (2013.01); *G11C 16/26* (2013.01)

(58) Field of Classification Search
CPC ............ G11C 11/4096; G11C 11/4085; G11C 11/4094; G11C 15/046; G11C 16/0483; G11C 16/26
See application file for complete search history.

(56) References Cited

U.S. PATENT DOCUMENTS

| 6,317,349 | B1 * | 11/2001 | Wong | G11C 15/046 365/49.17 |
| 9,984,759 | B1 * | 5/2018 | Yeh | G11C 29/50016 |
| 10,910,057 | B2 * | 2/2021 | Alrod | G11C 16/08 |
| 11,410,727 | B1 * | 8/2022 | Hoang | G11C 16/3404 |
| 2009/0190404 | A1 | 7/2009 | Roohparvar | |

(Continued)

FOREIGN PATENT DOCUMENTS

| TW | 201104843 | 2/2011 |
| WO | 2020219122 | 10/2020 |

OTHER PUBLICATIONS

"Office Action of Taiwan Counterpart Application", issued on May 23, 2024, pp. 1-5.

(Continued)

*Primary Examiner* — Mushfique Siddique
(74) *Attorney, Agent, or Firm* — J.C. PATENTS (57) ABSTRACT

An in memory searching device, including multiple first memory cell strings, a controller, and a sensing circuit, is provided. The first memory cell strings are commonly coupled to a first common bit line. Each of the first memory strings includes multiple first data storage layers. The first data storage layers respectively include multiple first memory cell pairs. The first memory cell pairs are respectively coupled to multiple first word line pairs. The controller selects at least one of the first data storage layers to be at least one selected data storage layer, and provides search data to at least one selected word line pair corresponding to the at least one selected data storage layer. The sensing circuit senses a current on the first common bit line to generate a search result.

15 Claims, 11 Drawing Sheets

(56) References Cited

U.S. PATENT DOCUMENTS

| | | | | |
|---|---|---|---|---|
| 2016/0147464 | A1* | 5/2016 | Chang | G06F 12/0246 |
| | | | | 711/103 |
| 2016/0172037 | A1* | 6/2016 | Lee | G11C 16/26 |
| | | | | 365/185.12 |
| 2018/0322922 | A1* | 11/2018 | De Santis | G11C 16/0483 |
| 2022/0157379 | A1* | 5/2022 | Chen | G11C 16/08 |
| 2023/0036141 | A1* | 2/2023 | Tseng | G11C 16/26 |
| 2023/0075257 | A1* | 3/2023 | Lee | G11C 7/1069 |

OTHER PUBLICATIONS

Po-Hao Tseng et al., "Content Addressable Memory Device and Method for Data Searching and Comparing Thereof", Unpublished U.S. Appl. No. 17/583,254, filed Jan. 25, 2022.

Po-Hao Tseng et al., "Memory Device and Data Search Method for In-Memory Search", Unpublished U.S. Appl. No. 17/812,243, filed Jul. 13, 2022.

Po-Hao Tseng, "Analog Content Addressable Memory Device, Analog Content Addressable Memory Cell and Method for Data Searching and Comparing Thereof", Unpublished U.S. application No. U.S. Appl. No. 17/830,427, filed Jun. 2, 2022.

* cited by examiner

IN MEMORY SEARCHING DEVICE

BACKGROUND

Technical Field

The disclosure relates to an in memory searching device, and in particular to an in memory searching device which can improve search efficiency.

Description of Related Art

With the advancement of electronic technology, the development of artificial intelligence is becoming more and more mature. Subsequently, the demand for a large amount of data searching is generated. Accordingly, the in memory searching device is launched. With the increase in the amount of data to be searched due to the development of artificial intelligence, how to apply the in memory searching device to execute data search operations for a large amount of data which requires high search efficiently has become an important topic for persons skilled in the art.

SUMMARY

The disclosure provides an in memory searching device, which can perform layered data search on a memory to improve the efficiency of a data search operation.

An in memory searching device of the disclosure includes multiple first memory cell strings, a controller, and a sensing circuit. The first memory cell strings are commonly coupled to a first common bit line. Each of the first memory cell strings includes multiple first data storage layers. The first data storage layers respectively include multiple first memory cell pairs. The first memory cell pairs are respectively coupled to multiple first word line pairs. The controller is coupled to the first memory cell strings, selects one of the first data storage layers to be at least one selected data storage layer, and provides search data to at least one selected word line pair corresponding to the at least one selected data storage layer. The sensing circuit is coupled to the first common bit line and senses a current on the first common bit line to generate a search result.

Based on the above, the in memory searching device of the disclosure may divide the memory into multiple data storage layers. When performing the data search operation, the data search operation may be performed on one or more layers of the data storage layers, which can speed up the efficiency of data search.

DESCRIPTION OF THE EMBODIMENTS

Figure 1:
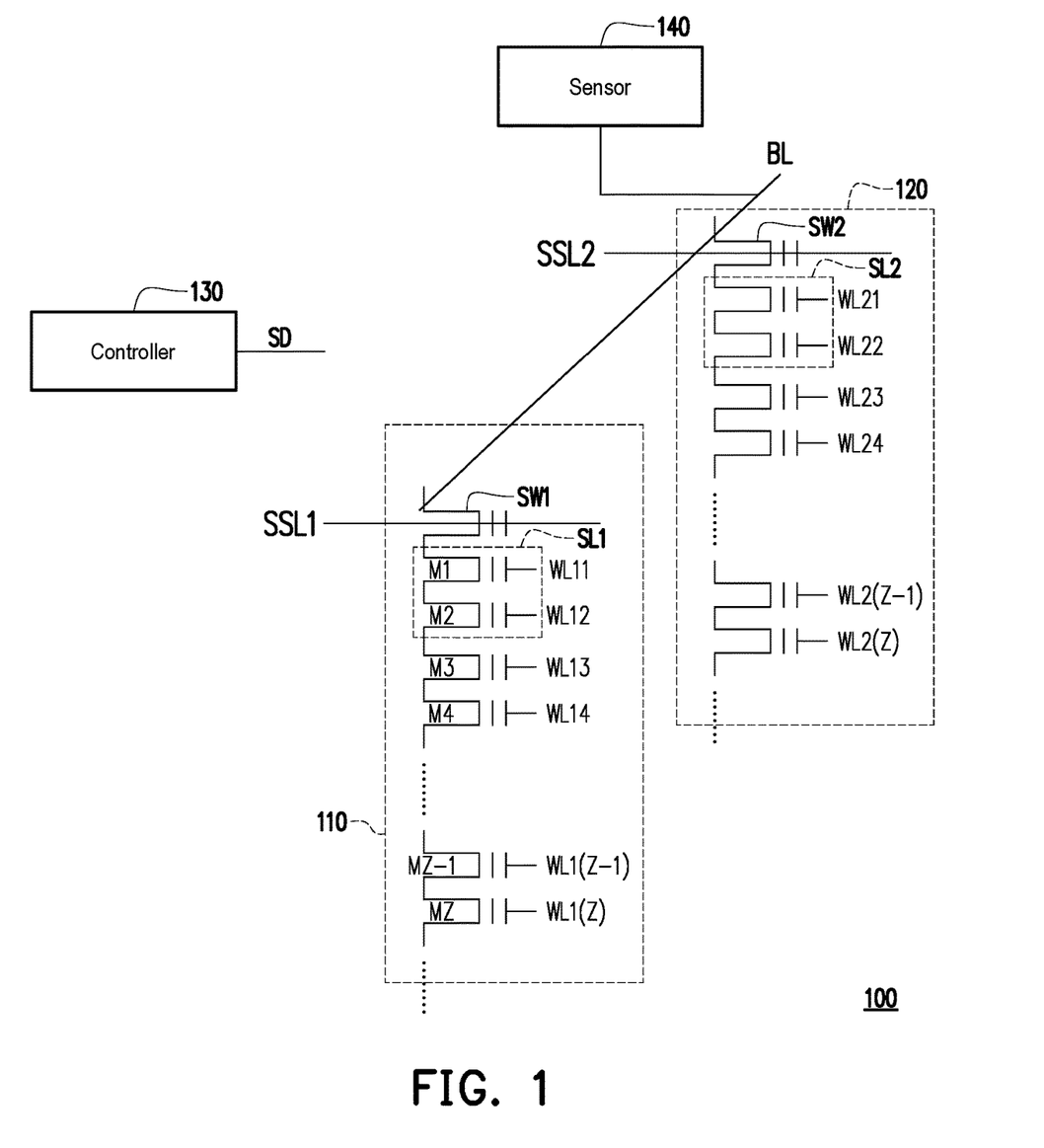
FIG. 1 is a schematic diagram of an in memory searching device according to an embodiment of the disclosure.

Please refer to FIG. 1. FIG. 1 is a schematic diagram of an in memory searching device according to an embodiment of the disclosure. An in memory searching device 100 includes multiple memory cell strings 110 and 120, a controller 130, and a sensor 140. The memory cell strings 110 and 120 are commonly coupled to a common bit line BL. The memory cell string 110 is coupled to the common bit line BL through a selection switch SW1, and the memory cell string 120 is coupled to the common bit line BL through a selection switch SW2. The selection switches SW1 and SW2 are respectively controlled by selection signals SSL1 and SSL2 to be turned on or off. The memory cell strings 110 and 120 may include multiple memory cells. Taking the memory cell string 110 as an example, the memory cell string 110 includes multiple memory cells M1 to MZ connected in series. The memory cells M1 to MZ may be NAND flash memory cells.

Each of the memory cell strings 110 and 120 has multiple memory cells coupled in series. The memory cells on the memory cell string 110 are respectively coupled to multiple word lines WL11 to WL1(Z). The memory cells on the memory cell string 120 are respectively coupled to multiple word lines WL21 to WL2(Z). In the embodiment, the memory cells on each of the memory cell strings 110 and 120 may be divided into groups two by two. Two memory cells in a single memory cell string 110 or 120 may form a data storage layer. Also taking the memory cell string 110 as an example, the memory cells M1 and M2 may form a data storage layer, the memory cells M3 and M4 may form another data storage layer, . . . , the memory cells MZ−1 and MZ may form the last data storage layer in the drawing.

In other embodiments of the disclosure, in a single memory cell string, two non-adjacent flash memory cells may also be applied to form a data storage layer. The method shown in the embodiment of FIG. 1 is only an example for illustration and is not intended to limit the scope of the disclosure.

On the other hand, the controller 130 is coupled to the memory cell strings 110 and 120. When executing a data search operation, the controller 130 may select at least one of the data storage layers in the memory cell strings 110 and 120 as one or more selected data storage layers. For example, in FIG. 1, when executing the data search operation, the controller 130 may select the data storage layer formed by the memory cells M1 and M2 in the memory cell string 110 as a selected data storage layer SL1. Also, the controller 130 selects two memory cells corresponding to the selected data storage layer SL1 in the memory cell string 120 as a selected data storage layer SL2.

In addition, the controller 130 may provide search data SD to a selected word line pair (including the word lines WL11 and WL12) on the selected data storage layer SL1 and a selected word line pair (including the word lines WL21 and WL22) on the selected data storage layer SL2 to perform the data search operation of the search data SD on the selected data storage layers SL1 and SL2. When the search data SD is digital data, the controller 130 may respectively provide multiple bits of the search data SD to the word lines WL11 and WL12 on the selected data storage layer SL1 and the word lines WL21 and WL22 on the selected data storage layer SL2. When the search data SD is analog data, the controller 130 may respectively provide multiple analog component voltages of the search data SD to the word lines WL11, WL12, WL21, and WL22.

The controller 130 of the embodiment of the disclosure may be constructed by applying a digital circuit or may be implemented by applying a memory controller well known to persons skilled in the art, and there is no particular limitation.

In the data search operation, the memory cells in the selected data storage layers SL1 and SL2 may be compared with the search data SD received on the word lines WL11, WL12, WL21, and WL22 according to storage data thereof, so as to generate a search result. In the embodiment, the comparison operation of the memory cells in the selected data storage layers SL1 and SL2 with the search data SD according to the storage data may generate a current on the common bit line BL. In the embodiment, the sensor 140 coupled to the common bit line BL may generate the search result through sensing the current on the common bit line BL. It is worth mentioning that in the embodiment, data similarity represented by the search result is positively correlated with the current on the common bit line BL.

Figure 2:
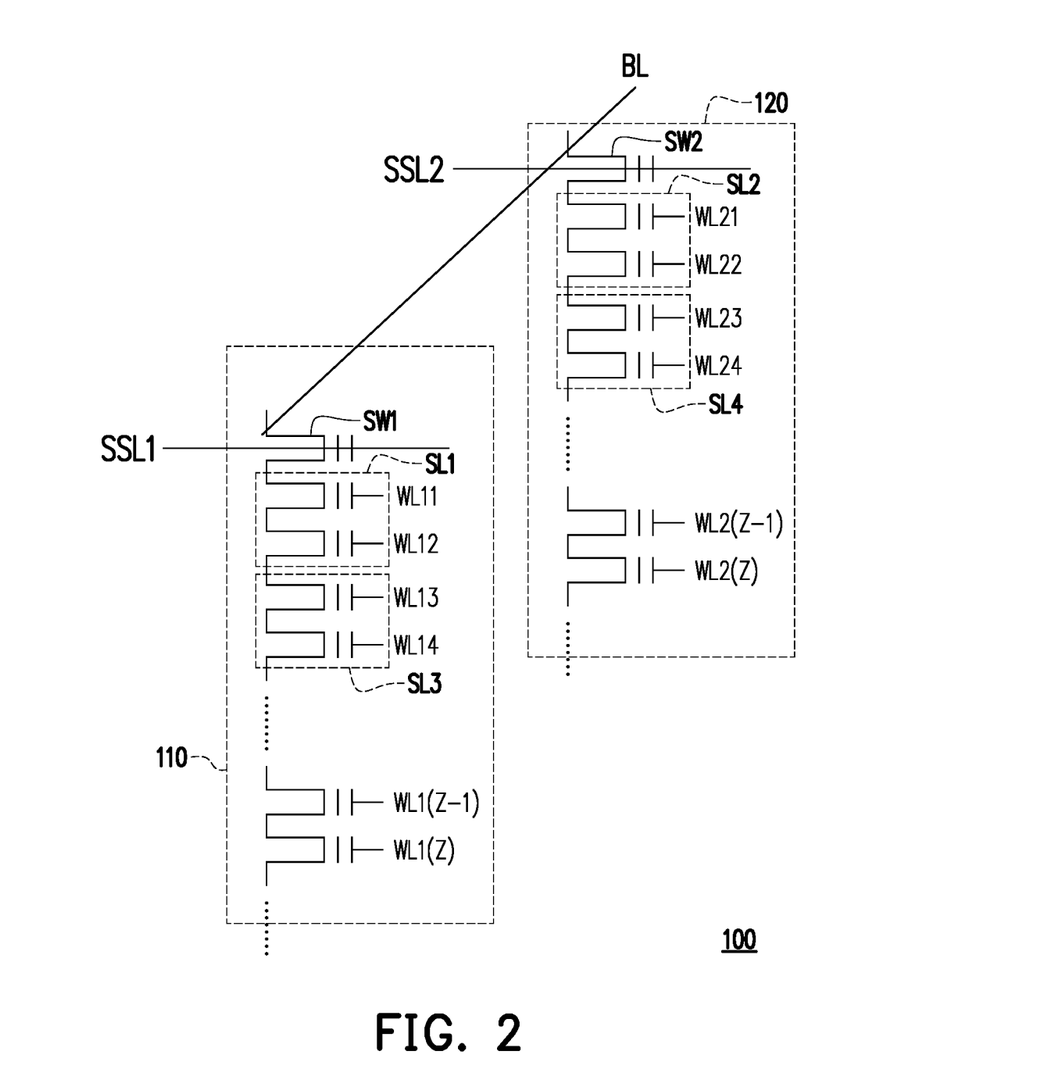
FIG. 2 is a schematic diagram of another implementation manner of the in memory searching device of the embodiment in FIG. 1 of the disclosure.

Please refer to FIG. 2 below. FIG. 2 is a schematic diagram of another implementation manner of the in memory searching device of the embodiment in FIG. 1 of the disclosure. In FIG. 2, two data storage layers in the memory cell string 110 are selected as selected data storage layers SL1 and SL3. Correspondingly, two data storage layers in the memory cell string 120 are selected as selected data storage layers SL2 and SL4. When executing the data search operation, the search data may be synchronously provided to two selected word line pairs (including the word lines WL11, WL12, WL13, and WL14) corresponding to the selected data storage layers SL1 and SL3 and two selected word line pairs (including the word lines WL21, WL22, WL23, and WL24) corresponding to the selected data storage layers SL2 and SL4. In this way, compared with the implementation manner of FIG. 1, the data search operation of data with a larger size may be executed, and the bandwidth of the data search operation can be effectively improved.

It is worth mentioning that in the implementation manner, the selected data storage layers SL1 and SL3 may be adjacently disposed data storage layers. In other implementation manners of the disclosure, the selected data storage layers may also be two data storage layers that are not adjacently disposed. The implementation manner of FIG. 2 is only an example for illustration and is not intended to limit the implementation scope of the disclosure.

Figure 3:
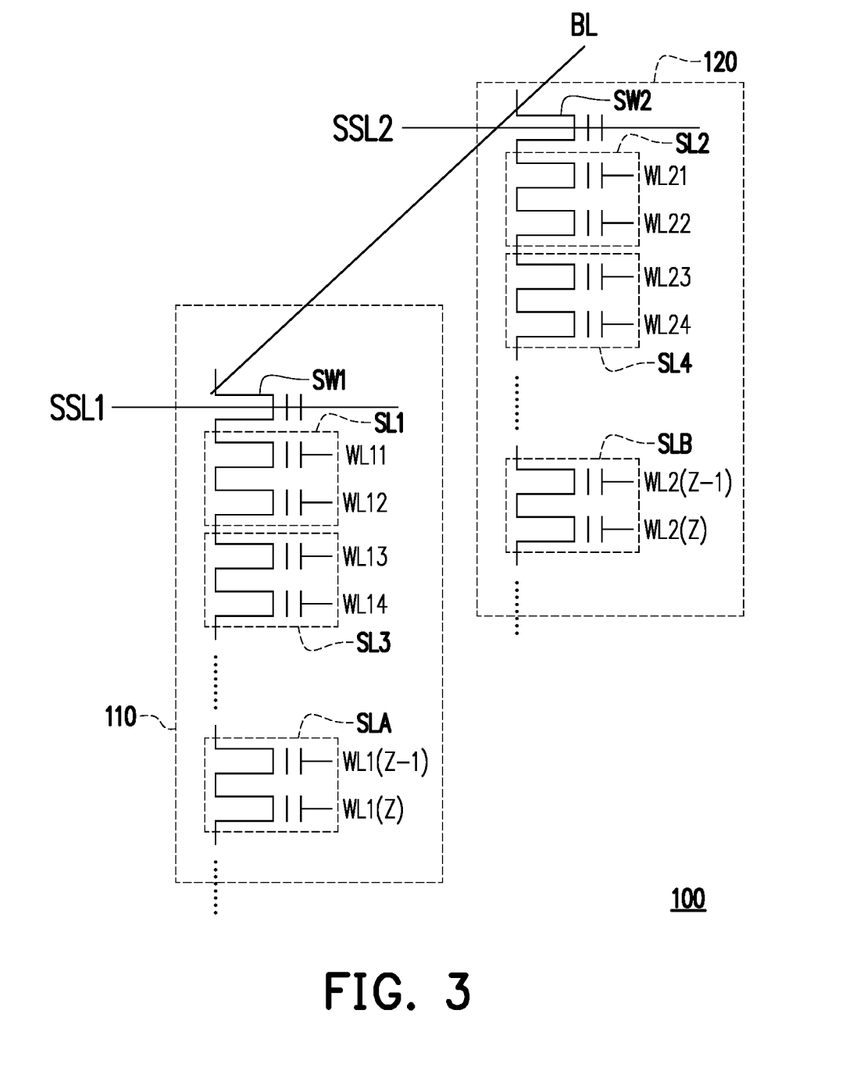
FIG. 3 is a schematic diagram of another implementation manner of the in memory searching device of the embodiment in FIG. 1 of the disclosure.

Please refer to FIG. 3 below. FIG. 3 is a schematic diagram of another implementation manner of the in memory searching device of the embodiment in FIG. 1 of the disclosure. In FIG. 3, all the data storage layers in the memory cell string 110 may be selected at the same time as selected data storage layers SL1 to SLA. Correspondingly, all the data storage layers in the memory cell string 120 may be selected at the same time as selected data storage layers SL2 to SLB.

When executing the data search operation, the search data may be synchronously provided to selected word line pairs (including the word lines WL11 to WL1(Z)) corresponding to the selected data storage layers SL1 to SLA and selected word line pairs (including the word lines WL21 to WL2(Z)) corresponding to the selected data storage layers SL2 to SLB. In this way, compared with the implementation manners of FIG. 1 and FIG. 2, the data search operation of data with a larger size may be executed, and the bandwidth of the data search operation can be effectively improved.

Figure 4A:
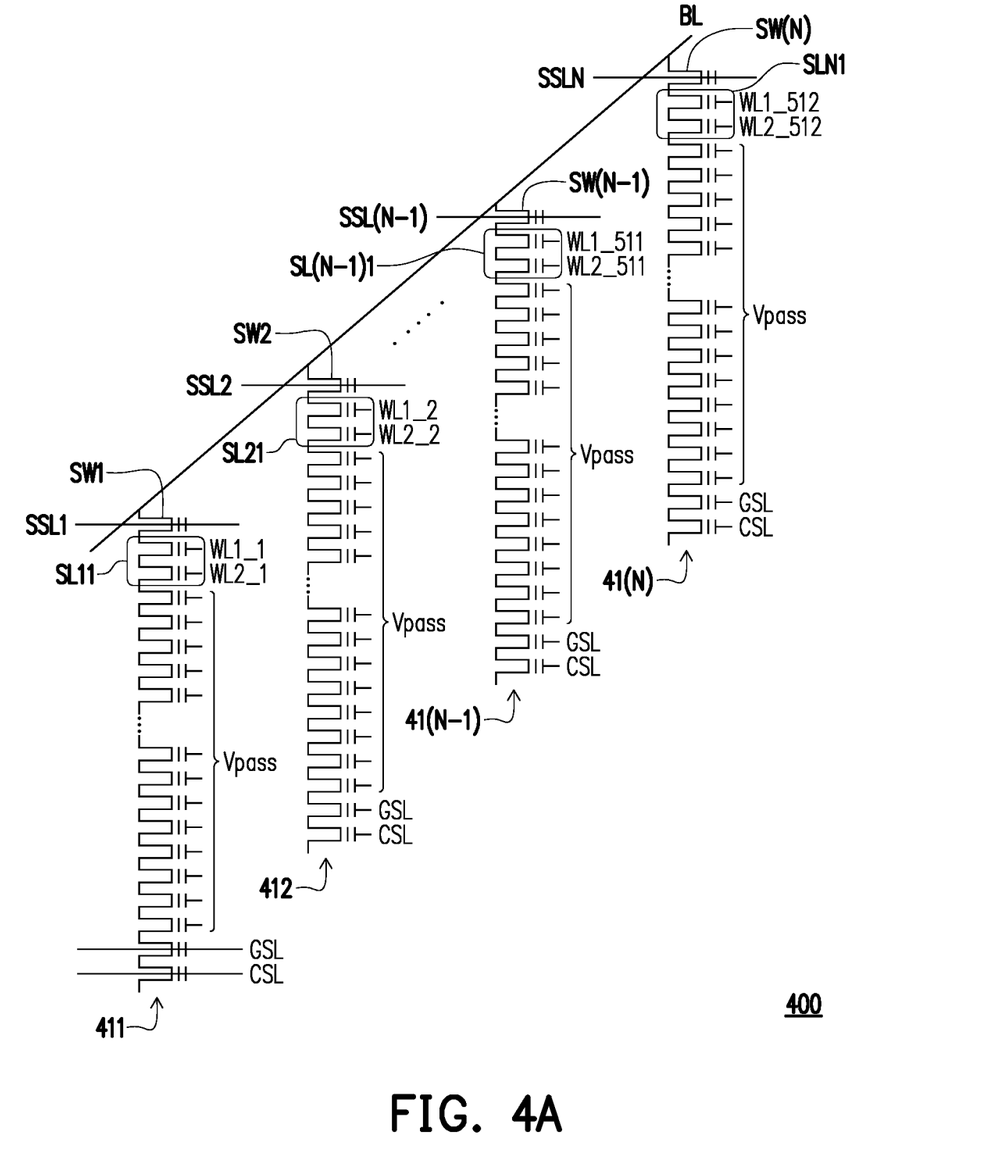
FIG. 4A and FIG. 4B are schematic diagrams of a data search operation of an in memory searching device according to an embodiment of the disclosure.
Figure 4B:
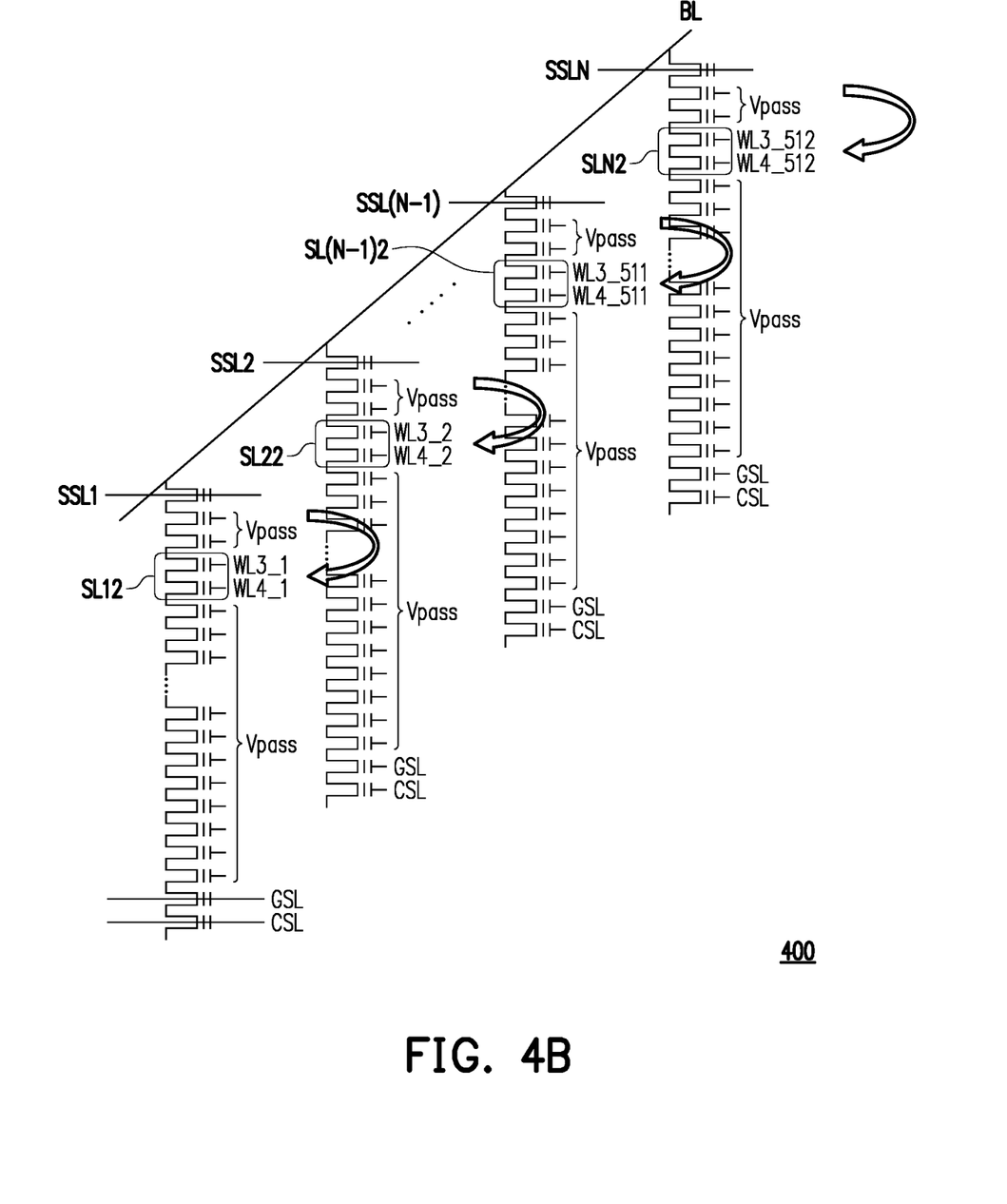

Please refer to FIG. 4A and FIG. 4B below. FIG. 4A and FIG. 4B are schematic diagrams of a data search operation of an in memory searching device according to an embodiment of the disclosure. In FIG. 4A and FIG. 4B, an in memory searching device 400 includes multiple memory cell strings 411 to 41(N). The memory cell strings 411 to 41(N) are respectively coupled to the common bit line BL through selection switches SW1 to SW(N). The selection switches SW1 to SW(N) are respectively controlled by selection signals SSL1 to SSLN. When executing a data search operation, the selection switches SW1 to SW(N) may be respectively turned on at the same time according to the selection signals SSL1 to SSLN.

In the embodiment, as shown in FIG. 4A, in a first interval of performing the data search operation, in the memory cell strings 411 to 41(N), a corresponding data storage layer is set as selected data storage layers SL11 to SLN1 at the same time. The controller may provide multiple components of the search data to selected word line pairs (including word lines WL1_1 to WL1_512 and word lines WL2_1 to WL2_512) on the selected data storage layers SL11 to SLN1. In this way, the in memory searching device 400 may complete the data search operation of a first layer.

Incidentally, in the data search operation, the in memory searching device 400 may provide a pass voltage Vpass to multiple word lines of an unselected data storage layer. In addition, each of the memory cell strings 411 to 41(N) has multiple switches controlled by selection signals GSL and CSL.

Next, in FIG. 4B, in a second interval of performing the data search operation, in the memory cell strings 411 to 41(N), another corresponding data storage layer is set as selected data storage layers SL12 to SLN2 at the same time. The controller may provide multiple components of the search data to selected word line pairs (including word lines WL3_1 to WL3_512 and word lines WL4_1 to WL4_512) on the selected data storage layers SL12 to SLN2. In this way, the in memory searching device 400 may complete the data search operation of a second layer.

According to the description of FIG. 4A and FIG. 4B, it can be analogized that the in memory searching device 400 may select each data storage layer in the memory cell strings 411 to 41(N) one by one according to the time sequence as a selected data storage layer, so as to execute a data search operation accordingly.

It is worth mentioning that in other embodiments of the disclosure, in the same time interval in the data search operation, corresponding to each memory cell string, multiple data storage layers may also be selected as selected data storage layers, and a data search operation is synchronously performed. In this way, the efficiency of the data search operation can be effectively improved.

Figure 5A:
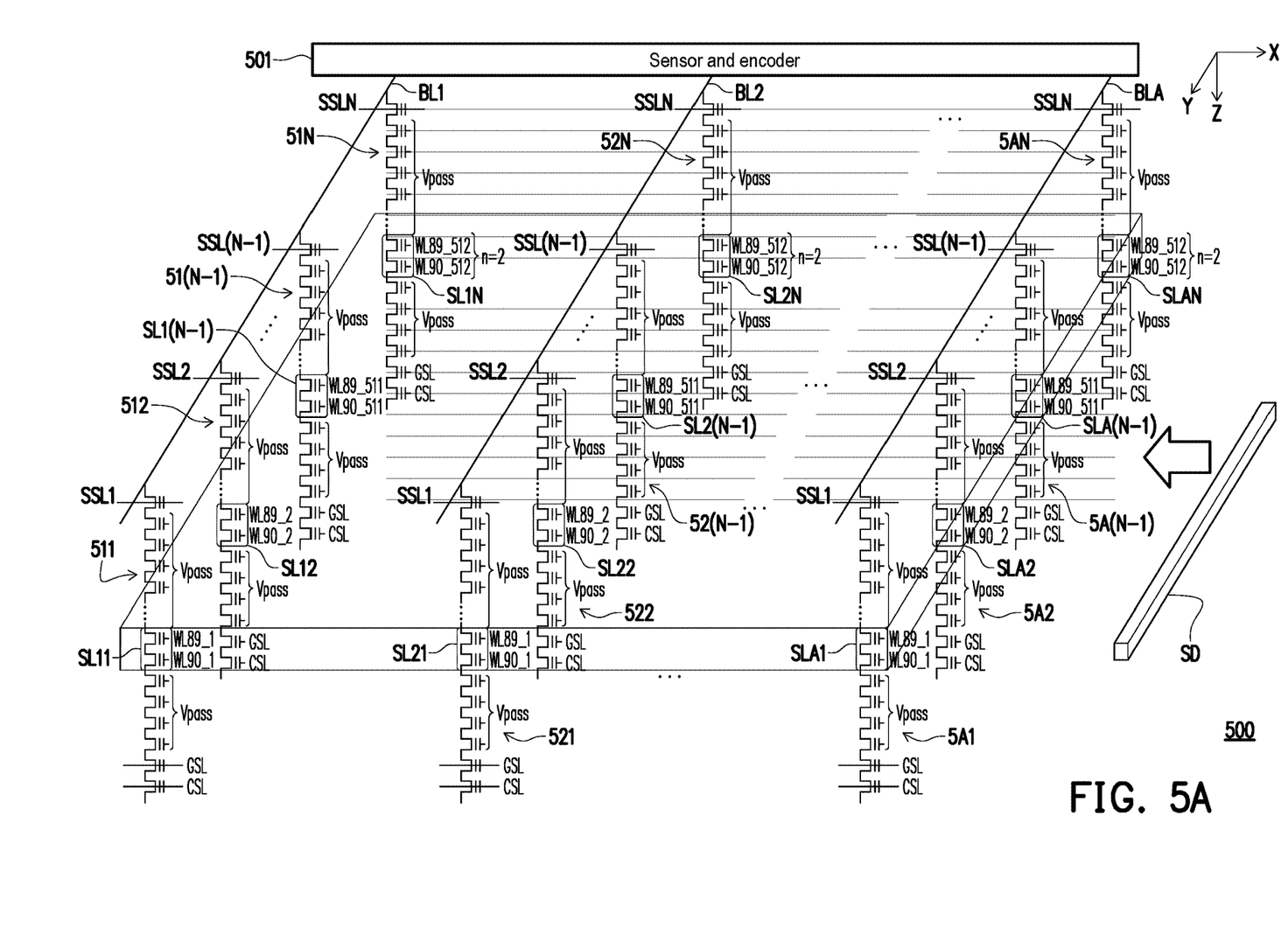
FIG. 5A to FIG. 5C are schematic diagrams of an in memory searching device and an implementation manner of a data search operation according to another embodiment of the disclosure.
Figure 5B:
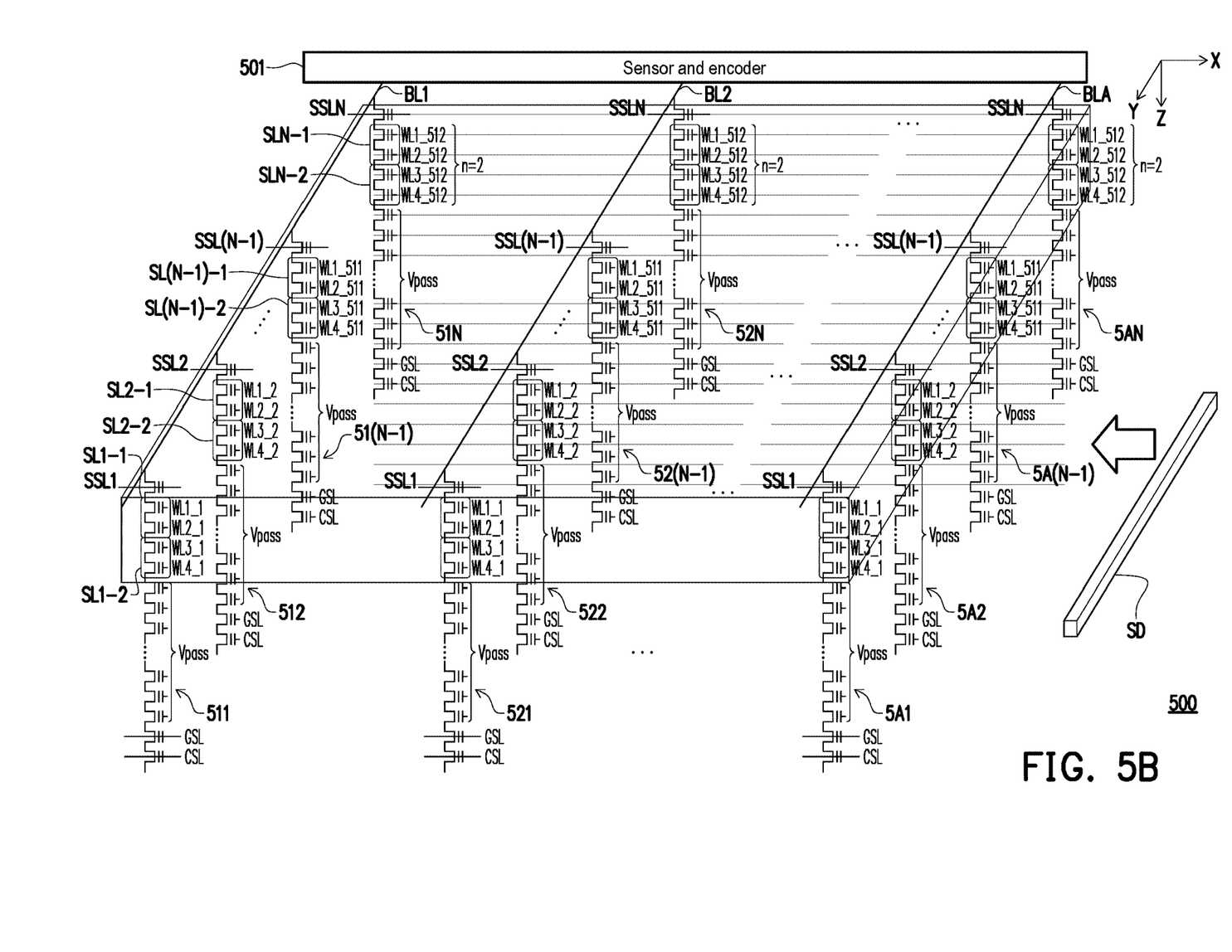
Figure 5C:
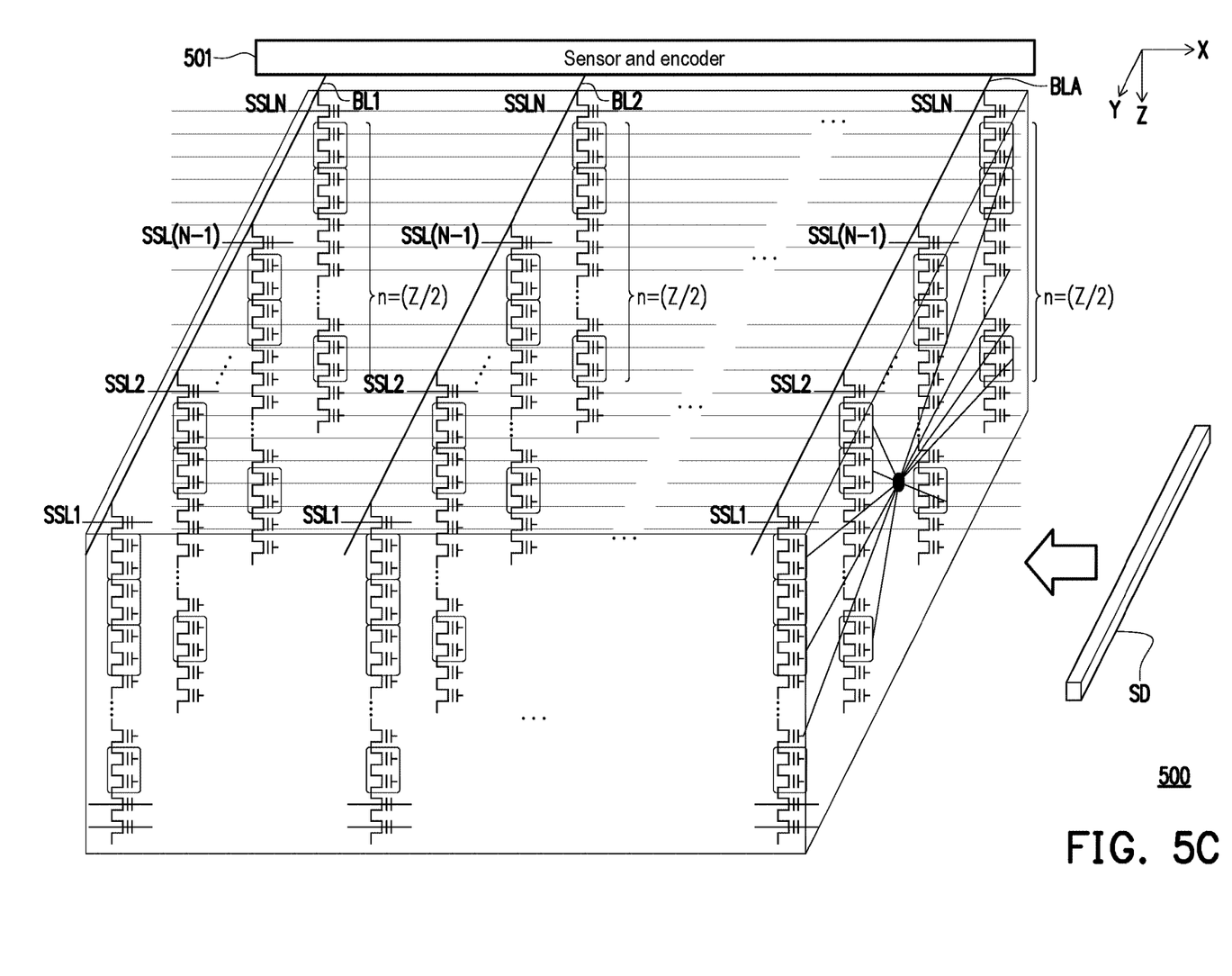

Please refer to FIG. 5A to FIG. 5C below. FIG. 5A to FIG. 5C are schematic diagrams of an in memory searching device and an implementation manner of a data search operation according to another embodiment of the disclosure. In FIG. 5A, an in memory searching device 500 includes multiple memory cell strings 511 to 5AN and a sensor and encoder 501. The memory cell strings 511 to 51N are commonly coupled to the common bit line BL1 through selection switches thereof, the memory cell strings 521 to 52N are commonly coupled to a common bit line BL2 through selection switches thereof, . . . , the memory cell strings 5A1 to 5AN are commonly coupled to a common bit line BLA through selection switches thereof. In the embodiment, the memory cell strings 511 to 5AN may be arranged into a cube structure. In the in memory searching device 500, each of the common bit lines BL1 to BLA extends along a Y-axis direction, each word line extends along an X-axis direction, and multiple memory cells of each of the memory cell strings 511 to 5AN are coupled in series along a Z-axis direction. In addition, each of the memory cell strings 511 to 5AN has multiple switches controlled by the selection signals GSL and CSL.

The sensor and encoder 501 is coupled to the common bit lines BL1 to BLA. A sensor in the sensor and encoder 501 is used to sense a current on the common bit lines BL1 to BLA to generate a search result. An encoder in the sensor and encoder 501 is used to encode the search result to generate an encoded search result.

Incidentally, the sensor in the sensor and encoder 501 may be a sense amplifier and may be implemented by applying a sense amplifier circuit well known to persons skilled in the art. The encoder in the sensor and encoder 501 may be a digital circuit and may be disposed in a page buffer.

When the in memory searching device 500 executes a data search operation, in a single time interval, the in memory searching device 500 may set a data storage layer corresponding to the position of each of the memory cell strings 511 to 5AN as a selected data storage layer. In the embodiment, the in memory searching device 500 may respectively set the selected data storage layers SL11 to SL1N for the memory cell strings 511 to 51N, respectively set the selected data storage layers SL21 to SL2N for memory cell strings 521 to 52N, . . . , and respectively set the selected data storage layers SLA1 to SLAN for the memory cell strings 5A1 to 5AN.

In the embodiment, based on the mutual correspondence in terms of position, the selected data storage layers SL11 to SL1N are respectively coupled to the corresponding selected word line pairs with the selected data storage layers SL21 to SL2N, and the selected data storage layers SL21 to SL2N are also respectively coupled to the corresponding selected word line pairs with the selected data storage layers SLA1 to SLAN.

On the other hand, in the data search operation, the search data SD may be split into multiple parts, which are respectively provided to the selected word line pairs coupled to the selected data storage layers SL11 to SLAN. The selected word line pairs include word lines WL89_1 to WL89_512 and word lines WL90_1 to WL90_512. The word lines WL89_1 to WL89_512 respectively form multiple word line pairs with the word lines WL90_1 to WL90_512.

In addition, a word line of an unselected data storage layer receives the pass voltage Vpass.

In the data search operation of FIG. 5A, the number of the selected data storage layer of each of the memory cell strings 511 to 5AN is 1 (n=1). Moreover, when executing the data search operation, the in memory searching device 500 may sequentially set a data storage layer of each of the memory cell strings 511 to 5AN according to the time sequence in different time intervals through the controller to obtain a selected data storage layer, and then execute the data search operation through sending the search data SD to the selected word line pairs of the selected data storage layer.

In the implementation manner of FIG. 5B, the in memory searching device 500 may set the number of the selected data storage layers of each of the memory cell strings 511 to 5AN to 2 (n=2) in the same time interval of the data search operation. Also, the data search operation is performed through splitting the search data SD into multiple components, which are respectively provided to the selected word line pairs corresponding to the selected data storage layers. In the embodiment, the selected word line pairs include the word lines WL1_1 to WL4_1, WL1_2 to WL4_2, . . . , and WL1_512 to WL4_512.

When executing the data search operation, the in memory searching device 500 may sequentially set two data storage layers of each of the memory cell strings 511 to 5AN according to the time sequence in different time intervals through the controller to respectively obtain two selected data storage layers, and then execute the data search operation through sending the search data SD to the selected word line pairs of the selected data storage layer.

In the implementation manner of FIG. 5C, the in memory searching device 500 may set all the data storage layers of each of the memory cell strings 511 to 5AN as the selected data storage layers at the same time in the data search operation. The number n of the selected data storage layers is Z/2, where Z is the number of memory cells in each of the memory cell strings 511 to 5AN. Also, the data search operation is performed through splitting the search data SD into multiple components, which are respectively provided to the selected word line pairs corresponding to the selected data storage layers. In this way, the data search operation for all storage data of the entire in memory searching device 500 may be completed through a one-time data search operation.

According to the above description, it can be known that the in memory searching device 500 of the disclosure may perform the data search operation through setting the number n of the selected data storage layers according to the requirement of timekeeping, which can effectively improve the efficiency of the data search operation.

Figure 6A:
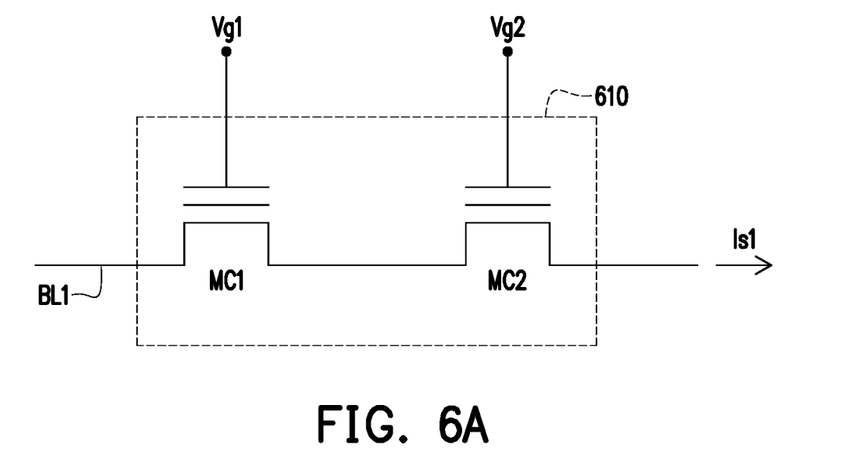
FIG. 6A to FIG. 6D are schematic diagrams of multiple execution manners of a data search operation of a selected data storage layer in an in memory searching device according to an embodiment of the disclosure.

Please refer to FIG. 6A to FIG. 6D below. FIG. 6A to FIG. 6D are schematic diagrams of multiple execution manners of a data search operation of a selected data storage layer in an in memory searching device according to an embodiment of the disclosure. In FIG. 6A, a selected data storage layer 610 of the embodiment of the disclosure includes memory cells MC1 and MC2. The memory cells MC1 and MC2 may respectively be a single-level cell (SLC), a multi-level cell (MLC), a triple-level cell (TLC), a quad-level cell (QLC), or a storage cell that stores analog data. Word lines of the memory cells MC1 and MC2 may respectively receive bias voltages Vg1 and Vg2 generated according to the search data, and generate a current Is1 reflecting the search result on the common bit line BL1 according to the search result.

Figure 6B:
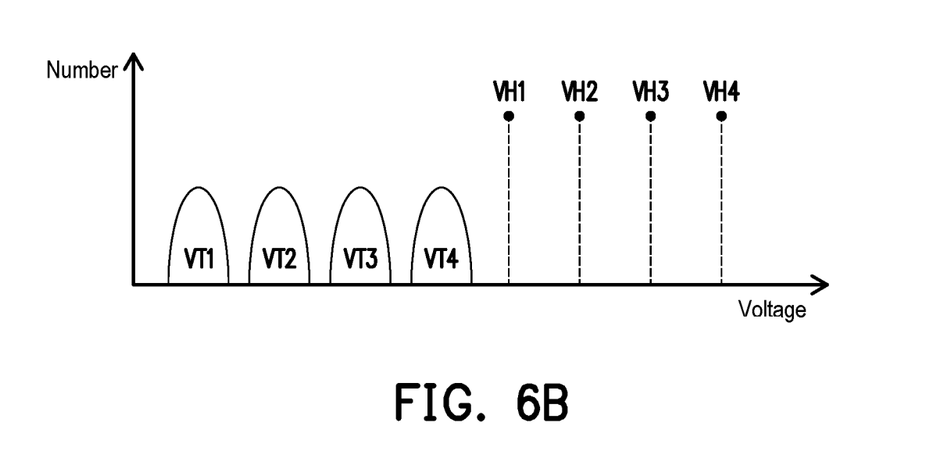

In FIG. 6B, the selected data storage layer 610 may have storage data DAT. The storage data DAT includes a first bit D1 and a second bit D2. The storage data DAT may be encoded according to voltage distributions VT1 to VT4 of threshold voltages Vth1 and Vth2 of the memory cells MC1 and MC2, as shown in the following table.

TABLE 1

| [Vth1 Vth2] | DAT = [D1 D2] |
|---|---|
| [VT1 VT4] | [0 0] |
| [VT2 VT3] | [0 1] |
| [VT3 VT2] | [1 0] |
| [VT4 VT1] | [1 1] |
| [VT1 VT3] | [0 X] (for example, [0 0] or [0 1]) |
| [VT1 VT2] | [X 0] (for example, [1 0] or [0 0]) |
| [VT3 VT1] | [1 X] (for example, [1 0] or [1 1]) |
| [VT2 VT1] | [X 1] (for example, [0 1] or [1 1]) |
| [VT4 VT4] | Invalid data |
| [VT1 VT1] | Don't care |

When executing the data search operation, voltages respectively received by gates of the memory cells MC1 and MC2 through the corresponding word lines may be one of voltages VH1 to VH4. The voltages received by the memory cells MC1 and MC2 are generated according to the corresponding search data, wherein taking the two-bit search data as an example, the corresponding relationship between the search data and the voltages VH1 to VH4 is shown in Table 2.

TABLE 2

| Voltage | Search data |
|---|---|
| [VH1 VH4] | [0 0] |
| [VH2 VH3] | [0 1] |
| [VH3 VH2] | [1 0] |
| [VH4 VH1] | [1 1] |
| [VH4 VH4] | Wildcard |

When performing the data search operation, the memory cells MC1 and MC2 may generate the current Is1 on the bit line BL1 according to a voltage difference between the voltages received by the gates and storage data thereof.

Figure 6C:
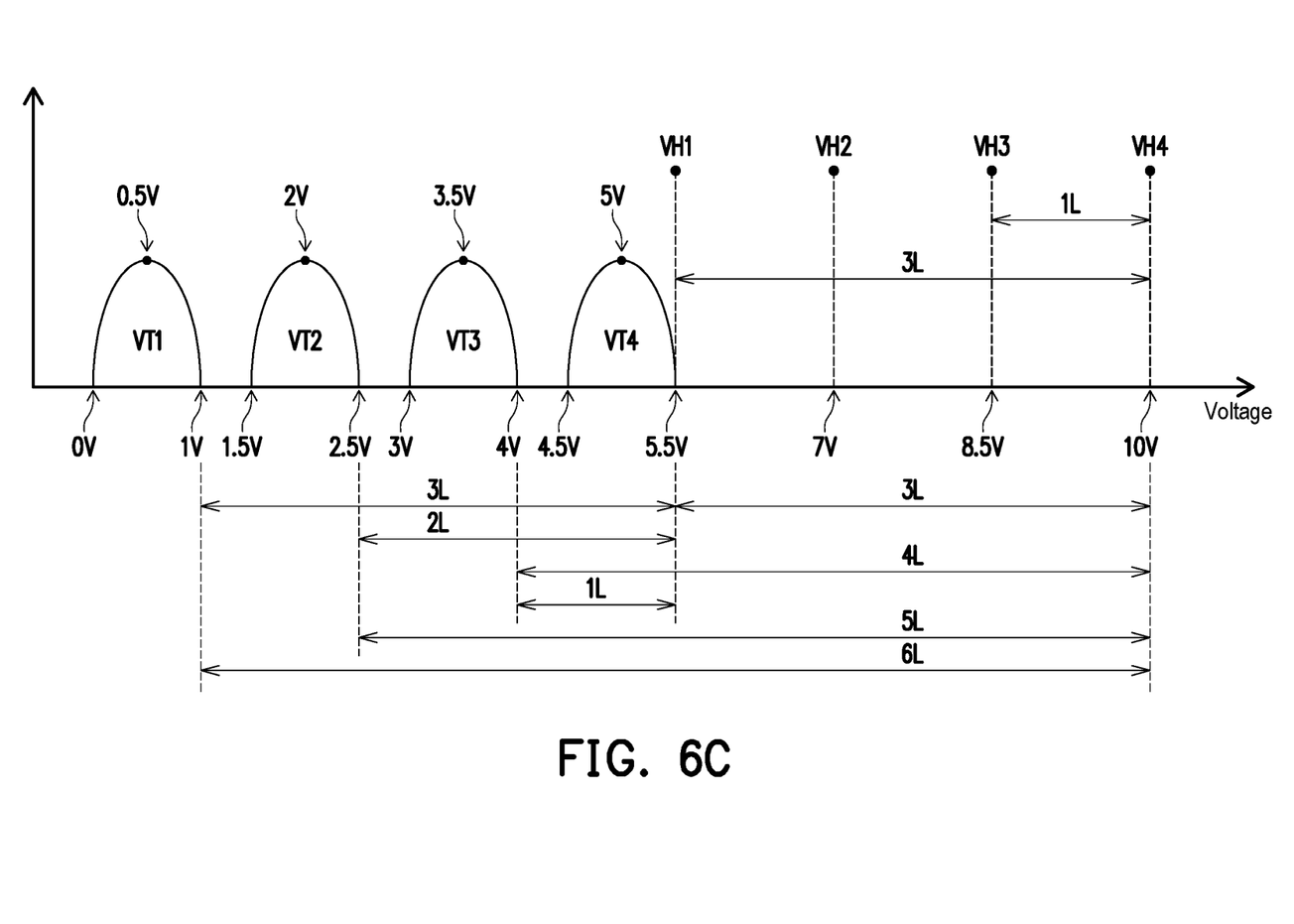

Next, please refer to FIG. 6C. The voltage distributions VT1 to VT4 respectively being 0V→1V, 1.5V→2.5V, 3V→4V, and 4.5V→5.5V, and the voltages VH1 to VH4 respectively being 5.5V, 7V, 8.5V, and 10V are taken as an example. The peak values of the voltage distributions VT1 to VT4 respectively correspond to the voltages 0.5V, 2V, 3.5V, and 5V. When executing the data search operation, when the search data is [0 0], the bias voltages Vg1 and Vg2 respectively received by the gates of the memory cells MC1 and MC2 are respectively equal to VH1 and VH4. If the storage data of the memory cells MC1 and MC2 is [0 0] at this time, the threshold voltage Vth1 of the memory cell MC1 is in the voltage distribution VT1, and the threshold voltage Vth2 of the memory cell MC2 is in the voltage distribution VT4. At this time, on the memory cell MC1, a difference value between the bias voltage Vg1 and the threshold voltage Vth1 may be 5.5V−1V=4.5V. Calculated by taking every 1.5V as a level L, the difference value between the bias voltage Vg1 and the threshold voltage Vth1 on the memory cell MC1 may be 3L. On the memory cell MC2, a difference value between the bias voltage Vg2 and the threshold voltage Vth2 may be 10V−5.5V=4.5V. The difference value between the bias voltage Vg2 and threshold voltage Vth2 on the memory cell MC2 may be 3L.

In other words, under this condition, when the search data matches the storage data, the memory cells MC1 and MC2 may generate the current Is1 corresponding to 3L.

When executing the data search operation, when the search data is [0 0], the bias voltages Vg1 and Vg2 respectively received by the gates of the memory cells MC1 and MC2 are respectively equal to VH1 and VH4. If the storage data of the memory cells MC1 and MC2 is [0 1] at this time, the threshold voltage Vth1 of the memory cell MC1 is in the voltage distribution VT2, and the threshold voltage Vth2 of the memory cell MC2 is in the voltage distribution VT3. The difference value between the bias voltage Vg1(=VH1) and the threshold voltage Vth1(=VT2) of the memory cell MC1 may be 2L. The difference value between the bias voltage Vg2(=VH4) and the threshold voltage Vth2(=VT3) of the memory cell MC2 may be 4L.

Since the memory cells MC1 and MC2 are connected in series, the selected data storage layer 610 may generate the current Is1 corresponding to 2L.

When executing the data search operation, when the search data is [0 0], the bias voltages Vg1 and Vg2 respectively received by the gates of the memory cells MC1 and MC2 are respectively equal to VH1 and VH4. If the storage data of the memory cells MC1 and MC2 is [1 0] at this time, the threshold voltage Vth1 of the memory cell MC1 is in the voltage distribution VT3, and the threshold voltage Vth2 of the memory cell MC2 is in the voltage distribution VT2. The difference value between the bias voltage Vg1(=VH1) and the threshold voltage Vth1(=VT3) of the memory cell MC1 may be 1L. The difference value between the bias voltage Vg2(=VH4) and the threshold voltage Vth2(=VT2) of the memory cell MC2 may be 5L. Since the memory cells MC1 and MC2 are connected in series, the selected data storage layer 610 may generate the current Is1 corresponding to 1L.

When executing the data search operation, when the search data is [0 0], the bias voltages Vg1 and Vg2 respectively received by the gates of the memory cells MC1 and MC2 are respectively equal to VH1 and VH4. If the storage data of the memory cells MC1 and MC2 is [1 1] at this time, the threshold voltage Vth1 of the memory cell MC1 is in the voltage distribution VT4, and the threshold voltage Vth2 of the memory cell MC2 is in the voltage distribution VT1. The difference value between the bias voltage Vg1(=VH1) and the threshold voltage Vth1(=VT4 of the memory cell MC1) may be 0L. The difference value between the bias voltage Vg2(=VH4) and the threshold voltage Vth2(=VT1) of the memory cell MC2 may be 6L. Since the memory cells MC1 and MC2 are connected in series, the selected data storage layer 610 may generate the current Is1 corresponding to 0L.

It is not difficult to know from the above description that the size of the current Is1 generated by the data storage layer 610 is positively correlated with the similarity between the search data and the storage data.

It is worth mentioning that as long as the number of voltage distributions and the number of bias voltages received by the memory cells MC1 and MC2 are appropriately adjusted, the selected data storage layer 610 of the embodiment of the disclosure may also be used to store storage data of various different levels, and execute the data search operation of the search data of the corresponding level.

Figure 6D:
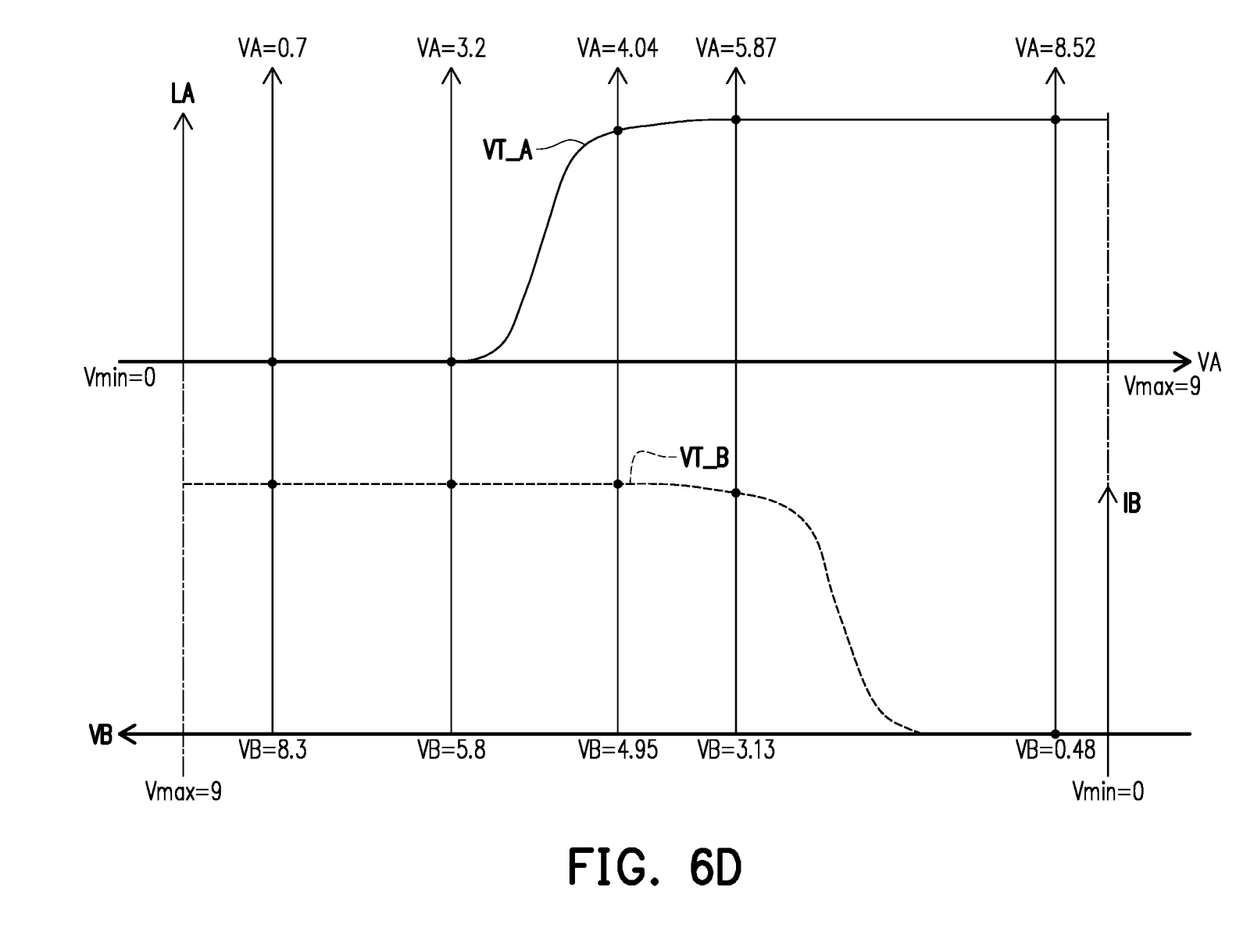

In FIG. 6D, the memory cells MC1 and MC2 in the selected data storage layer 610 may also be used to record analog storage data and perform a data search operation for analog search data. The threshold voltage of the memory cell MC1 may be a voltage curve VT_A, and the threshold voltage of the memory cell MC2 may be a voltage curve VT_B. The memory cells MC1 and MC2 may be respectively and independently programmed, so that the threshold voltages respectively correspond to the voltage curves VT_A and VT_B.

In addition, currents IA and IB respectively represent channel currents of the memory cells MC1 and MC2.

In the embodiment, the search data may be search voltages VA and VB, wherein the search voltages VA and VB are related by an expression VB=Vmax+Vmin−VA, where Vmax and Vmin are respectively the maximum analog search voltage and the minimum analog search voltage in the data search operation. In the embodiment, the maximum analog search voltage Vmax and the minimum analog search voltage Vmin are both constants, such as 9V and 0V respectively.

When the search voltage VA is equal to 0.7V and the search voltage VB is equal to 8.3V, the memory cell MC1 does not provide current, but the memory cell MC2 may provide current. When the search voltage VA is equal to 4.05V and the search voltage VB is equal to 4.95V, neither the memory cell MC1 nor the memory cell MC2 provides current. When the search voltage VA is equal to 8.52V and the search voltage VB is equal to 0.48V, the memory cell MC1 provides current, but the memory cell MC2 does not provide current.

In this way, the size of the current Is1 generated by the memory cells MC1 and MC2 in the selected data storage layer 610 may be used as the basis for the degree of similarity between the storage data and the search data in the generated search result. Similarly, the size of the current Is1 is positively correlated with the similarity between the storage data and the search data in the search result.

Incidentally, in other embodiments of the disclosure, the voltage curves of the threshold voltage of the memory cell MC1 and the threshold voltage of the memory cell MC2 may also be exchanged. In other words, the threshold voltage of the memory cell MC1 may have the voltage curve VT_B, and the threshold voltage of the memory cell MC2 may have the voltage curve VT_A.

In summary, the in memory searching device of the disclosure sets one or more data storage layers in the memory cell string as one or more selected data storage layers, and provides multiple parts of the search data to the selected word line pairs of one or more selected data storage layers at the same time, so that the data search operation may be synchronously executed for the one or more selected data storage layers. In this way, the rate of the in memory data search operation can be effectively increased to improve the performance of the data search operation.

What is claimed is:

1. An in memory searching device, comprising:
a plurality of first memory cell strings, commonly coupled to a first common bit line and respectively coupled to a plurality of selection signals, wherein each of the first memory cell strings comprises a plurality of first data storage layers, the first data storage layers respectively comprise a plurality of first memory cell pairs, and the first memory cell pairs are respectively coupled to a plurality of first word line pairs;
a controller, coupled to the first memory cell strings, selecting at least one of the first data storage layers of each of the first memory cell strings to be at least one selected data storage layer, and providing search data to at least one selected word line pair corresponding to the at least one selected data storage layer; and
a sensing circuit, coupled to the first common bit line and sensing a current on the first common bit line to generate a search result,
wherein the controller adjusts a number of the at least one selected data storage layer from 1 to Z/2, wherein Z is a number of a plurality of memory cells in each of the first memory cell strings.

2. The in memory searching device according to claim 1, wherein when a number of the at least one selected data storage layer is N, the controller synchronously selects N of the first data storage layers to be the at least one selected data storage layer, where N is a positive integer.

3. The in memory searching device according to claim 2, wherein the controller selects N of the first data storage layers to be the at least one selected data storage layer in a time sequence.

4. The in memory searching device according to claim 1, wherein the controller provides a pass voltage to a plurality of unselected word line pairs of a plurality of unselected data storage layers.

5. The in memory searching device according to claim 1, further comprising:
a plurality of second memory cell strings, commonly coupled to a second common bit line, wherein each of the second memory cell strings comprises a plurality of second data storage layers, the second data storage layers respectively correspond to the first data storage layers, the second data storage layers respectively comprise a plurality of second memory cell pairs, and the second memory cell pairs are respectively coupled to the same first word line pairs with the corresponding second memory cell pairs.

6. The in memory searching device according to claim 5, wherein the at least one selected data storage layer comprises each of the selected first data storage layers and each of the corresponding second data storage layers.

7. The in memory searching device according to claim 1, wherein when the search data is digital data, the controller respectively provides a plurality of bits of the search data to at least one selected word line pair corresponding to the at least one selected data storage layer.

8. The in memory searching device according to claim 1, wherein when the search data is analog data, the controller respectively provides a plurality of analog component voltages of the search data to at least one selected word line pair corresponding to the at least one selected data storage layer.

9. The in memory searching device according to claim 1, wherein a data similarity of the search result is positively correlated with the current on the first common bit line.

10. The in memory searching device according to claim 1, wherein a threshold voltage of each memory cell in each of the first memory cell pair is programmed in a first voltage range according to corresponding storage data, the controller sets the search data in a second voltage range, and the first voltage range does not overlap with the second voltage range.

11. The in memory searching device according to claim 10, wherein the storage data is digital data or analog data.

12. The in memory searching device according to claim 1, wherein two memory cells in each of the first memory cell pairs are adjacently or non-adjacently disposed.

13. The in memory searching device according to claim 1, further comprising:
an encoder, coupled to the sensing circuit and encoding the search result to generate an encoded search result.

14. The in memory searching device according to claim 13, wherein the encoded search result is multi-bit digital data or analog voltage.

15. The in memory searching device according to claim 1, wherein when a number of the at least one selected data storage layer is N, the selected data storage layers are adjacently or non-adjacently disposed two by two.

* * * * *